(12) United States Patent
Takeda

(10) Patent No.: US 7,368,666 B2
(45) Date of Patent: May 6, 2008

(54) SURFACE-MOUNTING TYPE ELECTRONIC CIRCUIT UNIT WITHOUT DETACHMENT OF SOLDER

(75) Inventor: Shuichi Takeda, Fukushima-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 0 days.

(21) Appl. No.: 11/351,780

(22) Filed: Feb. 10, 2006

(65) Prior Publication Data

US 2006/0185893 A1  Aug. 24, 2006

(30) Foreign Application Priority Data

Feb. 22, 2005  (JP) .............................. 2005-045465

(51) Int. Cl.
*H05K 1/16* (2006.01)
(52) U.S. Cl. .................. 174/260; 174/51; 174/261; 174/262; 174/263; 174/264; 29/832; 29/840; 257/659; 257/678; 257/686; 257/693; 257/774
(58) Field of Classification Search ............... 257/659, 257/678, 686, 693–695, 700–704, 723, 738, 257/774, 778, 780, 786; 29/832, 840; 174/51, 174/250, 260–266, 372, 35 R, 350, 520; 438/612, 613; 361/704, 816–818, 760–803
See application file for complete search history.

(56) References Cited

U.S. PATENT DOCUMENTS

| 4,218,578 A * | 8/1980 | Olschewski et al. ........ 174/372 |
| 4,830,264 A | 5/1989 | Bitaillou et al. |
| 5,166,772 A * | 11/1992 | Soldner et al. ............. 257/659 |
| 5,270,253 A * | 12/1993 | Arai et al. .................. 438/612 |
| 5,325,072 A * | 6/1994 | Kohjiro et al. ............. 330/286 |
| 5,508,889 A * | 4/1996 | Ii .............................. 361/816 |
| 5,752,182 A * | 5/1998 | Nakatsuka et al. ......... 455/333 |
| 5,969,417 A * | 10/1999 | Yamashita et al. .......... 257/693 |
| 6,270,357 B1 * | 8/2001 | Pfaff .......................... 439/71 |

(Continued)

FOREIGN PATENT DOCUMENTS

EP 1 168 445 1/2002

(Continued)

OTHER PUBLICATIONS

Search Report dated May 23, 2006, for corresponding European Patent Application No. 06100961.9.

*Primary Examiner*—Tuan T. Dinh
*Assistant Examiner*—Xiaoliang Chen
(74) *Attorney, Agent, or Firm*—Brinks Hofer Gilson & Lione

(57) ABSTRACT

A surface-mounting type electronic circuit unit includes pedestal bases. The pedestal bases are attached to first lands provided on the bottom surface of an insulating substrate and are made of plate-shaped metal material having a solder film on the outer surface thereof. Solder bumps are provided on second lands. Since the pedestal bases used as the mounting reference of the insulating substrate is formed in a plate shape and is placed on the same plane as the first lands and the mother board, the contact state between the first lands a the mother board is effectively stabilized. In addition, since the solderable amount is more than that of a conventional invention, the solder is not detached due to an impact.

16 Claims, 2 Drawing Sheets

U.S. PATENT DOCUMENTS

| | | | |
|---|---|---|---|
| 6,316,735 B1* | 11/2001 | Higashiguchi | 174/260 |
| 6,417,685 B1* | 7/2002 | Akram et al. | 324/765 |
| 6,462,960 B1* | 10/2002 | Watanabe | 361/816 |
| 7,183,498 B2* | 2/2007 | Ogura et al. | 174/387 |
| 2001/0008301 A1* | 7/2001 | Terui | 257/659 |
| 2001/0053068 A1 | 12/2001 | Murayama et al. | |
| 2002/0001178 A1* | 1/2002 | Iijima et al. | 361/704 |
| 2002/0003695 A1* | 1/2002 | Spratte et al. | 361/818 |
| 2002/0057560 A1* | 5/2002 | Okada | 361/818 |
| 2003/0030134 A1* | 2/2003 | Tao | 257/678 |
| 2003/0231088 A1* | 12/2003 | Kikuchi et al. | 333/247 |
| 2004/0195667 A1* | 10/2004 | Karnezos | 257/686 |
| 2005/0248927 A1* | 11/2005 | Mashimo et al. | 361/816 |
| 2006/0221591 A1* | 10/2006 | Kong | 361/818 |

FOREIGN PATENT DOCUMENTS

| | | |
|---|---|---|
| EP | 1 429 389 | 6/2004 |
| JP | 08-236911 | 9/1996 |
| JP | 10163263 | 6/1998 |

* cited by examiner his SURFACE-MOUNTING TYPE ELECTRONIC CIRCUIT UNIT WITHOUT DETACHMENT OF SOLDER

BACKGROUND OF THE INVENTION

1. Field of the Invention

The present invention relates to a surface-mounting type electronic circuit unit suitable for use in an electronic device such as short-range radio device.

2. Description of the Related Art

Drawings of a conventional surface-mounting type electronic circuit unit will be described. FIG. 3 is a cross-sectional view showing main parts of a conventional surface-mounting type electronic circuit unit, and FIG. 4 is an exploded perspective view showing main parts of the conventional surface-mounting type electronic circuit unit as seen from the back side thereof. Hereinafter, the structure of the conventional surface-mounting type electronic circuit unit will be described with reference to FIGS. 3 and 4. Wiring patterns 52 are provided on the top surface of a quadrilateral insulating substrate 51. Various electronic components 53 are mounted on the wiring patterns 52 to form a desired electric circuit.

In addition, first lands 54 are provided at corners on the bottom surface of the insulating substrate 51, respectively, and a plurality of second lands 55 having the same area as that of the first lands 54 are provided on the bottom surface of the insulating substrate 51 so as to be arranged along the circumference thereof. The first and the second lands 54 and 55 are connected to the wiring patterns 52 by connecting conductors 56.

Each of balls 57, which is made of metal material having a solder film on the outer surface thereof, is soldered to each of the first lands 54 by the solder film, and the solder bumps 58 are provided on the second lands 55. Furthermore, a box-shaped cover 59 made of a metal sheet is fixed to the insulating substrate 51 in a state of covering the electronic component 53, thereby forming the conventional surface-mounting type electronic circuit unit (for example, see JP-A-2003-20933).

As shown in FIG. 3, in the conventional surface-mounting type electronic circuit unit having the above-mentioned structure, when the balls 57 and the solder bumps 58 are placed on conductive patterns (not shown) of a mother board 60, the balls 57 are used as a mounting reference of the insulating substrate 51 with respect to the mother board 60, so that the insulating substrate 51 is placed parallel to the mother board 60.

In this state, when soldering is performed by a reflow furnace, the solder film of each ball 57 and solder of each solder bump 58 is melted so as to be soldered to the conductive patterns of the mother board 60. Accordingly, the conventional surface-mounting type electronic circuit unit is surface-mounted on the mother board 60 (for example, see JP-A-2003-20933).

In the conventional surface-mounting type electronic circuit unit, it is possible to reliably perform soldering between the second lands 55 and the mother board 60 by means of the solder bumps 58, which have more an amount of solder than the balls 57, and to use the balls 57 as the mounting reference of the insulating substrate 51. However, since the balls 57 come in point contact with the first lands 54 and the mother board 60 in an unstable state and have less solderable amount, the solder may be detached due to an impact.

The conventional surface-mounting type electronic circuit unit has the following problem. That is, the balls 57 are used as a mounting reference of the insulating substrate 51. In this case, since the balls 57 come in point contact with the first lands 54 and the mother board 60 in an unstable state and have less solderable amount, the solder may not be detached due to an impact.

SUMMARY OF THE INVENTION

It is an advantage of an aspect of the invention to provide a surface-mounting type electronic circuit unit that can be reliably soldered without detachment of solder.

In order to solve the above-mentioned problems, a surface-mounting type electronic circuit unit according to a first aspect of the invention includes an insulating substrate of which wiring patterns are formed on the top surface, electronic components that are connected to the wiring patterns, a plurality of first lands that are formed on the bottom surface of the insulating substrate, a plurality of second lands that are connected to the wiring patterns and are formed on the bottom surface of the insulating substrate, the pedestal bases that are soldered to the first lands, and the solder bumps that are provided on the second lands. The pedestal bases are made of plate-shaped metal material having a solder film on the outer surface thereof, and are soldered so that the top surfaces of the pedestal bases are positioned on the first lands. Further, the pedestal bases are used as a mounting reference of the insulating substrate with respect to the mother board, so that the bottom surfaces of the pedestal bases and the solder bumps are soldered to the mother board.

In addition, according to a second aspect of the invention, the area of the first lands is larger than that of the second lands or several times larger than that of the second lands, and the area of the top and bottom surfaces of the pedestal bases is larger than that of the second lands or several times larger than that of the second lands.

Furthermore, according to a third aspect of the invention, the pedestal bases are disposed to be positioned at three corners of a triangular shape.

Moreover, according to a fourth aspect of the invention, the pedestal bases are disposed to be positioned at four corners of a quadrilateral shape.

In addition, according to a fifth aspect of the invention, the pedestal bases are disposed to be positioned at four corners of the quadrilateral insulating substrate.

Further, according to a sixth aspect of the invention, electronic components thinner than the pedestal bases are mounted at the center on the bottom surface of the insulating substrate.

Furthermore, according to a seventh aspect of the invention, the above-mentioned surface-mounting type electronic circuit unit further includes a cover that is made of a metal sheet and covers the electronic components mounted on the top surface of the insulating substrate. In this case, the insulating substrate is provided with a hole which is formed at a position of the first lands so as to vertically pass therethrough. In addition, when protrusions provided on the cover are inserted into the hole, the protrusion is soldered to the first lands so that the cover is grounded to the first lands.

DESCRIPTION OF THE PREFERRED EMBODIMENT

Figure 1:
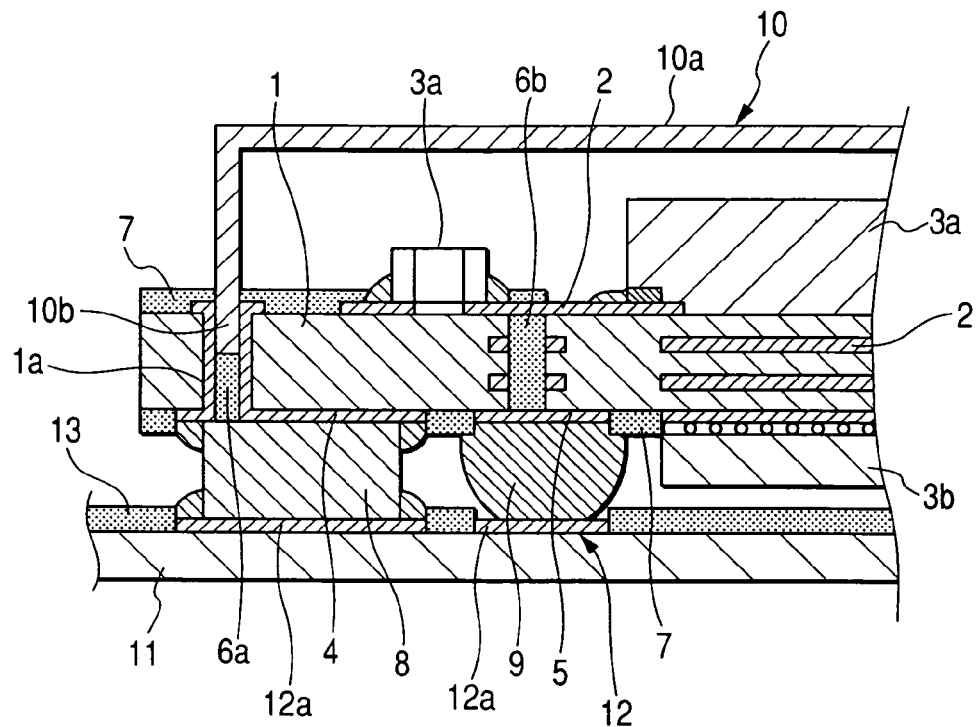
FIG. 1 is a cross-sectional view showing main parts of a surface-mounting type electronic circuit unit according to the invention.
Figure 2:
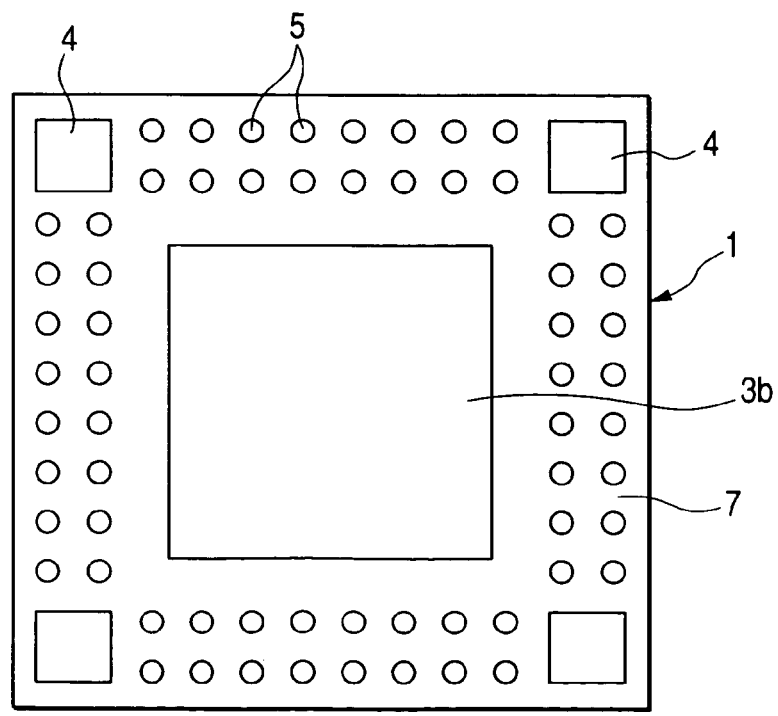
FIG. 2 is a bottom view showing the state of lands in the surface-mounting type electronic circuit unit according to the invention.
Figure 3:
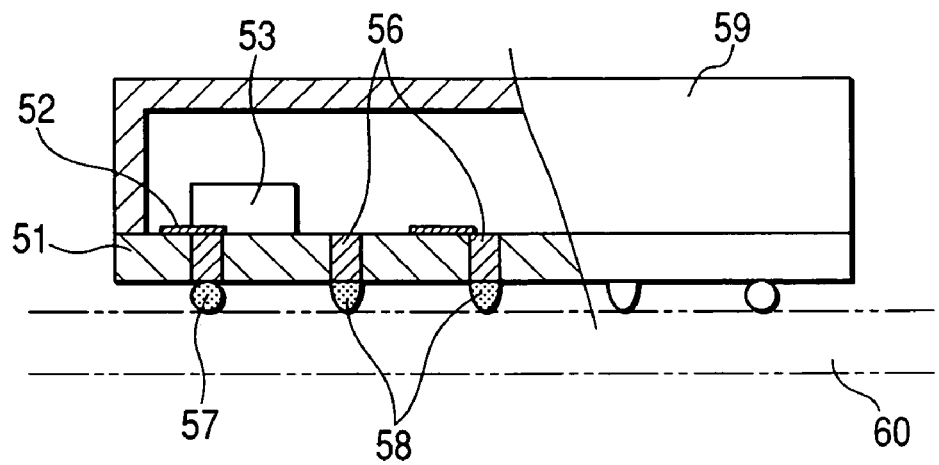
FIG. 3 is a cross-sectional view showing main parts of a conventional surface-mounting type electronic circuit unit.
Figure 4:
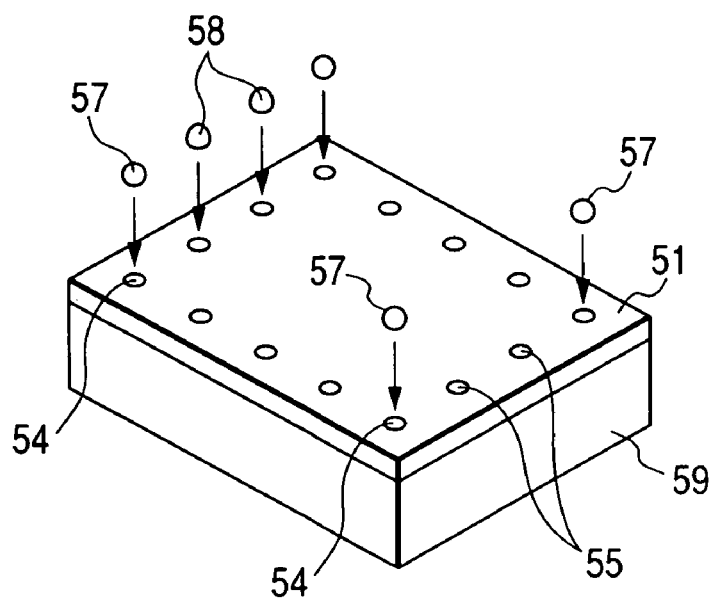
FIG. 4 is an exploded perspective view showing main parts of the conventional surface-mounting type electronic circuit unit as seen from the back side thereof.

The drawings of a surface-mounting type electronic circuit unit according to the invention will be described. FIG. 1 is a cross-sectional view showing main parts of a surface-mounting type electronic circuit unit according to the invention, and FIG. 2 is a bottom view showing in a state of lands of the surface-mounting type electronic circuit unit according to the invention. Hereinafter, the structure of the surface-mounting type electronic circuit unit according to the invention will be described with reference to FIGS. 1 and 2. Wiring patterns 2 are provided on the top surface, in the laminated layer, and on the bottom surface of a quadrilateral insulating substrate 1, which is composed of laminated substrates. Various electronic components 3a and 3b are mounted on the wiring patterns 2, which are provided on the top and the bottom surfaces of the insulating substrate 1, to form a desired electric circuit.

In addition, quadrilateral first lands 4 are provided at corners on the bottom surface of the quadrilateral insulating substrate 1, respectively, and a plurality of circular second lands 5 smaller than the first lands 4 are provided on the bottom surface of the insulating substrate 1 so as to be arranged along the circumference thereof.

Furthermore, the area of the first lands 4 is as large as or several times larger than that of the second lands 5, and the first lands 4 are connected to the wiring patterns 2 for grounding, which are formed on the top surface of the insulating substrate 1, by a connecting conductor 6a formed in the hole 1a, which vertically passes through the insulating substrate 1 to be formed therein. In addition, the second lands 5 are connected to the hot wiring patterns 2, which are formed on the top surface of the insulating substrate 1, by a connecting conductor 6b such as a through hole.

Further, a solder resist film 7 is formed on the entire top and the bottom surfaces of the insulating substrate 1, except for lands of the wiring patterns 2 to which the first and second lands 4 and 5 or the electronic components 3a and 3b are connected. In this way, the lands serving as soldering areas to which the first and second lands 4 and 5 or the electronic components 3a and 3b are connected are formed.

In addition, the first lands 4 may be formed in the shape of a circle, an ellipse, a triangle, a quadrangle, or a polygon having more than five sides.

The pedestal bases 8 are made of quadrilateral plate-shaped metal material having a solder film on the outer surface thereof. The areas of the top and bottom surfaces of each pedestal base 8 is as large as or several times larger than the area of the second lands 5, and the pedestal bases 8 are soldered to the first lands 4 by the solder film so that the top surface of the pedestal bases 8 is positioned on the same plane as the first lands 4.

Furthermore, the thickness of the pedestal bases 8 is larger than that of the electronic component 3b mounted on the bottom surface of the insulating surface 1, and the pedestal bases 8 may be formed in the shape of a circle, an ellipse, a triangle, a quadrangle, a polygon having more than five sides, or a star, etc.

The solder bumps 9 are provided on the second lands 5, and the solder bumps 9 are made of a ball-shaped solder or a hemispherical solder. The hemispherical solder is obtained as follows: Cream solder coated or printed on the second lands 5 is melted by a reflow furnace, and then is formed in a hemispherical shape.

A box-shaped cover 10 made of a metal sheet includes a box-shaped portion 10a, and a plurality of protrusions 10b that protrudes downward from the box-shaped portion 10a. When the box-shaped portion 10a covers the electronic component 3a mounted on the top surface of the insulating substrate 1 and the cover is positioned on the insulating substrate by inserting the protrusions 10b into the hole 1a, the cover 10 is soldered to the first lands 4 or the connecting conductor 6a to be attached to the insulating substrate 1 and is grounded to the wiring patterns 2 for grounding and the first lands 4. In this way, the surface-mounting type electronic circuit unit according to the invention is formed.

As shown in FIG. 1, in the surface-mounting type electronic circuit unit according to the invention having the above-mentioned structure, when the pedestal bases 8 and the solder bumps 9 are placed on lands 12a of a conductive pattern 12 provided on a mother board 11 of an electronic device, the pedestal bases 8 are used as a mounting reference, which are used to mount the insulating substrate 1 on the mother board 11, so that the insulating substrate 1 is placed on the same plane as the mother board 11.

In this case, the bottom surface of the pedestal bases 8 is positioned on the same plane as the lands 12a of the conductive pattern 12. In this state, when soldering is performed by the reflow furnace, the solder film of the pedestal bases 8 and solder of the solder bumps 9 are melted so as to be soldered to the lands 12a of the mother board 11. Accordingly, the surface-mounting type electronic circuit unit according to the invention is surface-mounted on the mother board 11.

In addition, the entire top surface of the mother board 11 except for the lands 12a is coated with a solder resist film 13.

Furthermore, in the embodiment, the pedestal bases 8 are disposed at four corners of the quadrilateral insulating substrate 1 so as to be used as a mounting reference of the insulating substrate 1. However, the pedestal bases 8 may be disposed to be positioned at three corners of a triangular shape so as to be used as a mounting reference of the insulating substrate 1, or the pedestal bases 8 may be disposed to be positioned at four corners of a quadrilateral shape so as to be used as a mounting reference of the insulating substrate 1.

A surface-mounting type electronic circuit unit according to the invention includes an insulating substrate of which wiring patterns are formed on the top surface, electronic component that is connected to the wiring patterns, a plurality of first lands that are formed on the bottom surface of the insulating substrate, a plurality of second lands that are connected to the wiring patterns and are formed on the bottom surface of the insulating substrate, the pedestal bases that are soldered to the first lands, and the solder bumps that are provided on the second lands. The pedestal bases are made of plate-shaped metal material having a solder film on the outer surface thereof, and are soldered so that the top surfaces of the pedestal bases are positioned on the first lands. Further, the pedestal bases are used as a mounting reference of the insulating substrate with respect to the mother board, so that the bottom surfaces of the pedestal bases and the solder bumps are soldered to the mother board.

That is, since the pedestal bases used as the mounting reference of the insulating substrate are formed in a plate shape and is placed on the same plane as the first lands and the mother board, the contact state between the lands and the mother board is effectively stabilized. In addition, since the solderable amount is more than that of the conventional invention, the solder is not detached due to an impact.

Furthermore, since the soldering between the second lands and the mother board is performed by means of the solder bumps, the solderable amount increases. For this reason, it is possible to reliably perform the soldering between the second lands and the mother board by means of the solder bumps.

Moreover, the area of the first lands is larger than that of the second lands or several times larger than that of the second lands, and the area of the top and bottom surfaces of the pedestal bases is larger or several times than that of the second lands. Accordingly, the mounting state of the pedestal bases is further stabilized. Since the solderable amount can increase due to the solder film, it is possible to more reliably perform the soldering.

In addition, since the pedestal bases are disposed to be positioned at three corners of a triangular shape, the insulating substrate is stabilized with respect to the mother board even if there are a small number of the pedestal bases.

Furthermore, since the pedestal bases are disposed to be positioned at four corners of a quadrilateral shape, the insulating substrate is stabilized with respect to the mother board even if there are a small number of the pedestal bases.

In addition, since the pedestal bases are disposed to be positioned at four corners of the quadrilateral insulating substrate, the insulating substrate is stabilized with respect to the mother board even if there are a small number of the pedestal bases.

Further, since the electronic component thinner than the pedestal bases is mounted at the center on the bottom surface of the insulating substrate, the electronic components can be dispersed on the top and bottom surfaces of the insulating substrate. Therefore, it is possible to reduce the size of the surface-mounting type electronic circuit unit. In addition, the pedestal bases allow the electronic components, which are disposed on the bottom surface of the insulating substrate, to be separated from the conductive pattern of the mother board with high accuracy.

Furthermore, the above-mentioned surface-mounting type electronic circuit unit further includes a cover that is made of a metal sheet and covers the electronic components mounted on the top surface of the insulating substrate. In this case, the insulating substrate is provided with a hole which is formed at a position of the first lands so as to vertically pass therethrough. In addition, when protrusions provided on the cover are inserted into the hole, the protrusions are soldered to the first lands so that the cover is grounded to the first lands. Therefore, the cover can be positioned by the protrusions, and be reliably grounded to the first lands.

The invention claimed is:

1. A surface-mounting type electronic circuit unit comprising:
    an insulating substrate of which wiring patterns are provided on a top surface;
    an electronic component that is connected to the wiring patterns;
    a plurality of first lands that are provided on a bottom surface of the insulating substrate;
    a plurality of second lands that are connected to the wiring patterns and are provided on the bottom surface of the insulating substrate;
    pedestal bases that are soldered to the first lands;
    solder bumps that are provided on the second lands, and
    a cover that is made of a metal sheet and covers the electronic component mounted on the top surface of the insulating substrate,
    wherein the insulating substrate is provided with a hole that is formed at a position of the first lands so as to vertically pass therethrough,
    when protrusions provided on the cover and each having a length shorter than a thickness of the insulating substrate are inserted into the hole, the portion is soldered to the first lands so that the cover is grounded to the first lands,
    wherein the pedestal bases are made of plate-shaped metal material having a solder film on the outer surface thereof, and are soldered so that top surfaces of the pedestal bases are positioned on the first lands, and
    the pedestal bases are used as a mounting reference of the insulating substrate with respect to a mother board, so that bottom surfaces of the pedestal bases and the solder bumps are soldered to the mother board.

2. The surface-mounting type electronic circuit unit according to claim 1,
    wherein an area of the first lands is larger than that of the second lands and
    the area of the top and bottom surfaces of the pedestal bases is larger than that of the second lands.

3. The surface-mounting type electronic circuit unit according to claim 2,
    wherein the area of the first lands is several times larger than that of the second lands, and
    the area of the top and bottom surfaces of the pedestal bases is several times larger than that of the second lands.

4. The surface-mounting type electronic circuit unit according to claim 1,
    wherein the pedestal bases are disposed to be positioned at three corners of a triangular shape.

5. The surface-mounting type electronic circuit unit according to claim 1,
    wherein the pedestal bases are disposed to be positioned at four corners of a quadrilateral shape.

6. The surface-mounting type electronic circuit unit according to claim 1,
    wherein the pedestal bases are disposed to be positioned at four corners of the quadrilateral insulating substrate.

7. The surface-mounting type electronic circuit unit according to claim 1,
    wherein an electronic component thinner than the pedestal bases is mounted at the center on the bottom surface of the insulating substrate.

8. The surface-mounting type electronic circuit unit according to claim 2,
    wherein the pedestal bases are disposed to be positioned at three corners of a triangular shape.

9. The surface-mounting type electronic circuit unit according to claim 2,
    wherein the pedestal bases are disposed to be positioned at four corners of a quadrilateral shape.

10. The surface-mounting type electronic circuit unit according to claim 2,
    wherein the pedestal bases are disposed to be positioned at four corners of the quadrilateral insulating substrate.

11. The surface-mounting type electronic circuit unit according to claim 2,
wherein an electronic component thinner than the pedestal bases is mounted at the center on the bottom surface of the insulating substrate.

12. The surface-mounting type electronic circuit unit according to claim 3,
wherein the pedestal bases are disposed to be positioned at three corners of a triangular shape.

13. The surface-mounting type electronic circuit unit according to claim 3,
wherein the pedestal bases are disposed to be positioned at four corners of a quadrilateral shape.

14. The surface-mounting type electronic circuit unit according to claim 3,
wherein the pedestal bases are disposed to be positioned at four corners of the quadrilateral insulating substrate.

15. The surface-mounting type electronic circuit unit according to claim 3,
wherein an electronic component thinner than the pedestal bases is mounted at the center on the bottom surface of the insulating substrate.

16. A surface-mounting type electronic circuit unit comprising:
an insulating substrate of which wiring patterns are provided on a top surface;
an electronic component that is connected to the wiring patterns;
a plurality of first lands that are provided on a bottom surface of the insulating substrate;
a plurality of second lands that are connected to the wiring patterns and are provided on the bottom surface of the insulating substrate;
pedestal bases that are soldered to the first lands;
solder bumps that are provided on the second lands, and
a cover that is made of a metal sheet and covers the electronic component mounted on the top surface of the insulating substrate,
wherein the insulating substrate is provided with a hole that is formed at a position of the first lands so as to vertically pass therethrough, and a side part that is connected to the first lands is provided at a side surface of the hole,
when protrusions provided on the cover and each having a length shorter than a thickness of the insulating substrate are inserted into the hole, the portion is soldered to the side part and solder is filled within the hole so that the cover is grounded to the first lands,
wherein the pedestal bases are made of plate-shaped metal material having a solder film on the outer surface thereof, and are soldered so that top surfaces of the pedestal bases are positioned on the first lands, and
the pedestal bases are used as a mounting reference of the insulating substrate with respect to a mother board, so that bottom surfaces of the pedestal bases and the solder bumps are soldered to the mother board.

* * * * *